United States Patent [19]

Fontana

[11] Patent Number: 4,823,175

[45] Date of Patent: Apr. 18, 1989

[54] ELECTRICALLY ALTERABLE, NONVOLATILE FLOATING GATE MEMORY DEVICE

[75] Inventor: Gabriella Fontana, Vimercate, Italy

[73] Assignee: SGS Microelettronica S.p.A., Catania, Italy

[21] Appl. No.: 54,712

[22] Filed: May 27, 1987

[30] Foreign Application Priority Data

Jun. 3, 1986 [IT] Italy ............................. 83623 A/86

[51] Int. Cl.⁴ .................................................. H01L 29/78
[52] U.S. Cl. ........................................ 357/23.5; 365/185
[58] Field of Search ................... 357/23.5, 54; 365/185

[56] References Cited

U.S. PATENT DOCUMENTS 4,442,447 4/1984 Ipri ........................................ 357/23.5
4,590,504 5/1986 Guterman .......................... 357/23.5
4,622,737 11/1986 Ravaglia ............................. 357/23.5

Primary Examiner—William L. Sikes
Assistant Examiner—Mark Prenty
Attorney, Agent, or Firm—Pollock, Vande Sande & Priddy

[57] ABSTRACT

Disclosed is an electrically alterable, floating gate type, nonvolatile, semiconductor memory device wherein the gate oxide layer in the "injection" area between the silicon (drain region of the device) and the floating gate has an increased thickness with respect to the thickness of the same gate oxide layer over the channel region of the device in order to decrease the parasitic capacitance of the injection area, thus improving the programming threshold voltage characteristics. A method for fabricating the improved memory device is also disclosed.

1 Claim, 7 Drawing Sheets

ELECTRICALLY ALTERABLE, NONVOLATILE FLOATING GATE MEMORY DEVICE

FIELD OF THE INVENTION

This invention relates, in general, to semi-conductor memory devices and more particularly, to electrically alterable, read-only memory devices, of the floating gate type, utilized in microprocessor based systems, in dedicated nonvolatile memories, in TV channel selectors and in other comparable systems.

BACKGROUND OF THE INVENTION

Microprocessor-based systems and related arts, increasingly need read-only memory elements which can be altered by electrical means, i.e. memory elements which, although being able to retain data written thereon for relatively long periods of time (several years), offer the possibility of erasing and rewriting (reprogramming) all or some of the data contained therein by electrical means and essentially without needing to remove the microcircuit containing them from the apparatus for subjecting it to erasing treatments (preceding an eventual, necessarily total reprogramming) contemplating irradiation as it was necessary with the read-only memory devices of the FAMOS type, from "Floating Gate Avalanche Metal Oxide Semiconductor".

Lately, the art has progressed to the point where a number of nonvolatile memory devices, electrically alterable, have been successfully produced. Microprocessors or systems incorporating such memory devices, equally known as EE-PROM from "Electrically Erasable - Programmable Read-Only Memory" or as EA-PROM from "Electrically Alterable - Programmable Read-Only Memory", offer the great advantage, with respect of the devices of the prior art, of allowing both the erasing and rewriting of single bytes or the erasing of all the stored data.

The memory cell, that is the basic integrated semiconductor structure of such devices, is the so-called FLOTOX cell, from "Floating Gate Tunnel Oxide", which is described in detail in an article entitled: "16-J-EE-PROM Relies on Tunnelling for Byte-Erasable Program Storage" by W. S. Johson et al., "Electronics" of Feb. 28, 1980, pages 113-117. In this article, the author describes a FLOTOX structure where a cell utilizing a polycrystalline silicon floating gate structure, has such a structure charged with electrons (or vacancies) through a suitable "window" providing a thin layer of oxide between said floating gate structure and the monocrystalline silicon in correspondence to the drain region, by a Fowler-Nordheim tunnelling mechanism. That is, the mechanism exploited for trapping the charge in a floating gate electrode is conduction by tunnel effect of electrons (or vacancies) through a thin oxide dielectric layer caused by sufficiently high electric fields, generally over at least 10 MV/cm.

BRIEF DESCRIPTION OF THE DRAWINGS

Understanding the prior art and its drawbacks, as well as the description of the FLOTOX cell object of the present invention, will be easier and more immediate by referring to a series of drawings annexed to the present specification, wherein:

FIG. 5a is a diagram showing the programming characteristics of a FLOTOX cell of the known type shown in FIG. 4a;

FIGS. from 6 to 20 show the sequence of operations of the fabrication process for making the FLOTOX cell's structure of the present invention.

DETAILED DESCRIPTION OF THE INVENTION

Figure 1:
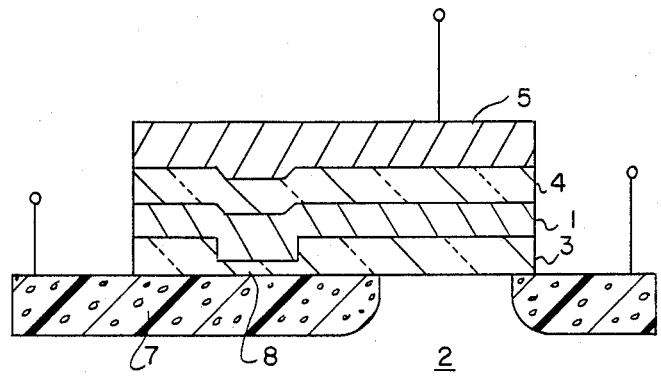
FIG. 1 is a schematic, elevation cross sectional view of the structure of a FLOTOX memory cell of the conventional type.

As schematically shown in FIG. 1, a typical configuration of a FLOTOX cell comprises a first level or layer of polycrystalline silicon 1, completely isolated, which constitutes the floating gate electrode. It is insulated from the monocrystalline silicon 2 by the layer of gate oxide 3. An insulating layer 4 of silicon oxide or of an equivalent dielectric, thermally grown or deposited by chemical vapor deposition (CVD) layer, insulates the first level polycrystalline silicon 1 from a second level of polycrystalline silicon 5, which constitutes the so-called control gate electrode. An appropriate window 6 is present in the gate oxide layer 3 for the transfer of electric charges by a tunnelling mechanism into the floating gate 1, in correspondence to the drain region 7 of the MOS device. In correspondence to said window, the insulation between the floating gate and the silicon is represented by an extremely thin layer of silicon oxide, called tunnel oxide 8, whose thickness is normally less than 100 Å with respect to the normal thickness of the gate oxide 3, which is typically between 500 and 800 Å.

Figure 2:
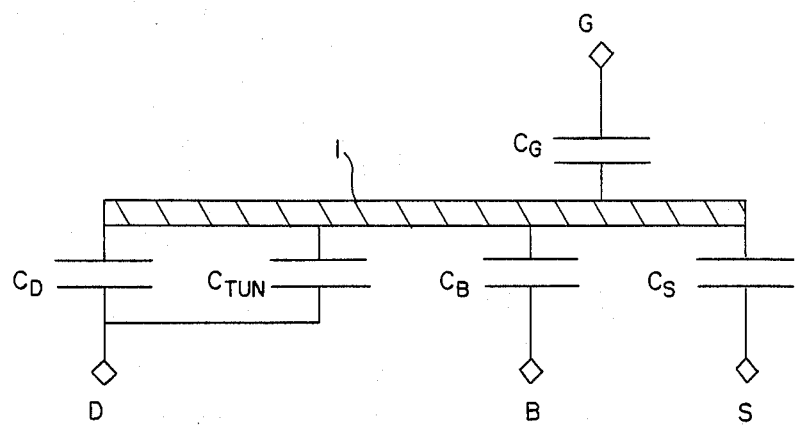
FIG. 2 is a diagram of the relevant capacitive couplings of the FLOTOX structure of FIG. 1.

The diagram of the relevant capacity couplings of the FLOTOX memory cell is schematically shown in FIG. 2. The potential to which the floating gate of the device settles depends on the potential values imposed upon the external electrodes, by its capacitive coupling with each one of those and by the stored electrical charge. From the diagram of FIG. 2, the following relation may be rewritten:

$$V_{FG} = V_D \frac{C_D + C_{TUN}}{C_{TOT}} + V_G \frac{C_G}{C_{TOT}} + V_B \frac{C_B}{C_{TOT}} + V_S \frac{C_S}{C_{TOT}} + \frac{Q}{C_{TOT}}$$

where:
$V_{FG}$ is the floating gate potential;
$V_D$ and $C_D$ are the drain voltage and the drain capacitance, respectively;
$C_{TUN}$ is the capacitance of the tunnel oxide;
$V_G$ and $C_G$ are, respectively, the substrate voltage and the substrate capacitance;

$V_B$ and $C_B$ are, respectively, the substrate voltage and the substrate capacitance;

$V_S$ and $C_S$ are, respectively, the source voltage and the source capacitance;

Q is the charge stored in the floating gate; and $C_{TOT} = C_D + C_{TUN} + C_G + C_B + C_S$.

The operating modes of the FLOTOX memory cell are the following:

(1) ERASING $$V_G = V_G \quad V_D = V_B = V_S = 0 \text{ therefore}$$

$$V_{FG} = V_G \frac{C_G}{C_{TOT}} + \frac{Q}{C_{TOT}}$$

and the electric field in the tunnel oxide 8 will be:

$$E_{ox} = \frac{1}{th_{ox}} (V_{FG} - V_D) = \frac{1}{th_{ox}} \left( V_G \frac{C_G}{C_{TOT}} + \frac{Q}{C_{TOT}} \right)$$

where $th_{ox}$ is the thickness of the tunnel oxide 8

(2) WRITING $$V_D = V_D \quad V_G = V_B = V_S = 0 \text{ therefore}$$

$$V_{FG} = V_D \frac{C_D + C_{TUN}}{C_{TOT}} + \frac{Q}{C_{TOT}}$$

and the electric field in the tunnel oxide 8 will be:

$$E_{ox} = \frac{1}{th_{ox}} (V_{FG} - V_D) =$$

$$\frac{1}{th_{ox}} \left( V_D \frac{C_D + C_{TUN}}{C_{TOT}} + \frac{Q}{C_{TOT}} - V_D \right)$$

by defining $\alpha_E = \frac{C_G}{C_{TOT}}$ and $\alpha_W = \frac{C_D + C_{TUN}}{C_{TOT}}$ the two conditions are obtained:

$$\text{ERASING } E_{ox} = \frac{1}{th_{ox}} \left( \alpha_E V_G + \frac{Q}{C_{TOT}} \right) \quad (1)$$

$$\text{WRITING } E_{ox} = -\frac{1}{th_{ox}} (1 - \alpha_W) V_D - \frac{Q}{C_{TOT}} \quad (2)$$

It may be easily observed that as the two electric fields are maximized, $\alpha_E$ is close to 1 and $\alpha_W$ is close to 0.

Aiming to contain as much as possible the voltages to be applied to the device for "WRITING" and "ERASING" data therein, it is necessary to reduce as much as possible the $\alpha_W$ parameter, i.e. the ratio between the tunnel capacitance and the drain capacitance ($C_D + C_{TUN}$) and the total capacitance of the "floating gate" system ($C_{TOT}$). In particular, the efforts of the known techniques for minimizing such a capacitance ratio have developed either towards the expedient of extending the overlapping area of the two polycrystalline silicon levels well above the field oxide surrounding the cell in order to increase the total capacitance ($C_{TOT}$) though sacrificing useful area and therefore limiting the degree of integration, or towards the quest for alternative structures (usually more complex) of the memory cell aimed to reduce as much as possible the value of the tunnel capacitance and that of the drain region of the cell.

Examples of proposals of this latter type are described in UK patent applications Nos. 830688 and 8306290, both of RCA Corporation of U.S.A. Essentially, according to such proposals, use is made of three levels of polycrystalline silicon, the second of which represents the floating gate structure which is "shielded" by a first level of polycrystalline silicon from the monocrystalline silicon substrate. A minuscule aperture or "window", defined by precise lithographic techniques of alignment through the first shielding polycrystalline silicon level, allows the necessary capacitive coupling between the monocrystalline silicon substrate and the floating gate for the write and erase operations (i.e. transfer of electrical charges by tunnel effect from or to the floating gate).

More generally, the efforts for reducing the programming voltages are notably addressed, through refinements of the fabrication techniques, towards the, following directions:

(1) reduction of the tunnel oxide area (limited by lithographic resolution);

(2) reduction of the dielectric thickness between the two polycrystalline silicon levels (limited by the inherent defectiveness of the insulating layer);

(3) increase of the overlapping area of the two polycrystalline silicon layers over the surrounding field oxide (limited by the necessity to keep as small as possible the dimensions of the unitary memory cell).

There exists, therefore, a clear necessity or utility of having a FLOTOX cell with improved threshold voltage characteristics, following programming, relative to conventional type FLOTOX cells and which are more easily fabricated in accordance with the normal fabrication techniques of MOS type semiconductor devices, without requiring particularly critical process steps.

According to the present invention, an improved floating gate type, semiconductor, nonvolatile memory device, generally known by the name of FLOTOX cell, is provided which has decisively better threshold voltage characteristics, following programming, with respect to those of a conventional type device made according to the known technique. The device of the invention is advantageously fabricated through a simple modification of a standard fabrication process of such integrated devices, which modification does not have any critical character and therefore does not introduce substantial additional difficulties to the standard fabrication process of this kind of device.

Figure 3:
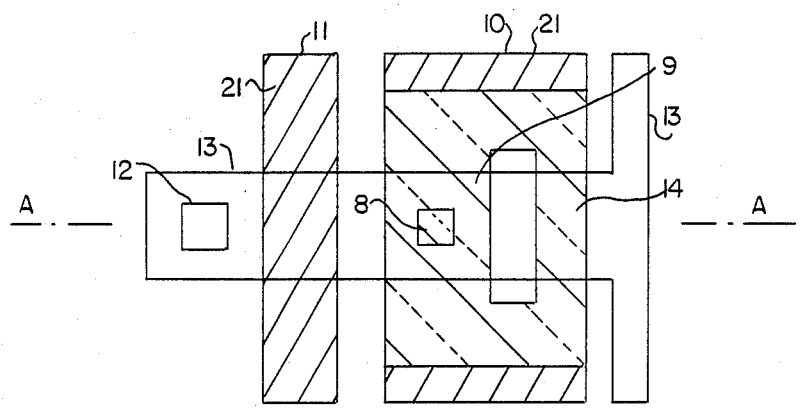
FIG. 3 is a schematic plan view of an elementary FLOTOX memory cell as practically made on a semiconductor chip.
Figure 4A:
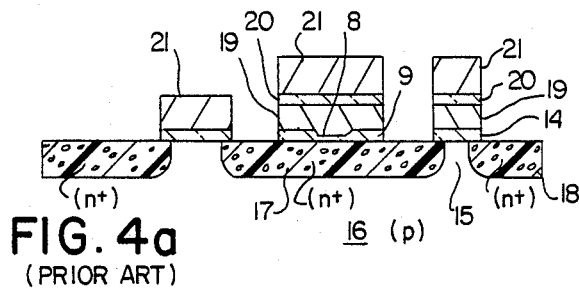
FIG. 4a is an elevation cross section of the elementary cell of FIG. 3.

FIG. 3 is a schematic plan view illustrating a conventional type FLOTOX cell, indicated with 10 in its entirety in the figure. In the plan view of FIG. 3 is also shown a selection MOS transistor 11, made in series to the FLOTOX cell itself, as well as the area of the "column" electrical connection, indicated with 12. The active area (i.e. the area not covered by the field oxide) of the elementary FLOTOX cell shown is the area contained inside the "T" shaped FIG. 13, a thick field oxide layer being present all around such an area. As it may be observed, also looking at FIG. 4a representing an elevation section of FIG. 3 along the section line A—A, there are two distinct zones in the gate oxide layer. The zone indicated with 14 of the oxide represents the real gate oxide layer of the device. In fact, in this region 14, the oxide overlies the channel region 15 of the monocrystalline semiconductor substrate 16 (e.g. p doped silicon) between the relative drain region 17

(e.g. n+ doped silicon) and the source region 18 (e.g. n+ doped silicon). The gate oxide layer extends also over the drain region of the device, relative to of the area indicated with 9 of FIG. 3. Within this area of the oxide (which at this point could also be called drain oxide) is formed the tunnel oxide zone 8. The first polycrystalline silicon level forming the floating gate is shown, besides by means of the characteristic shading, with 19, while with 20 is shown the insulating layer between the two conductive polycrystalline silicon layers, and with 21 the top layer or second level of polycrystalline silicon forming the control gate of the integrated device.

While in corresondence to the channel area 14 the insulating layer of gate oxide is an essential component of the device, the same insulating layer in correspondence to the zone 9 above the drain region, has the sole purpose of providing for an appropriate "injection" zone, i.e. an area having geometric characteristics such as to permit the formation of a tunnel oxide "window" 8. The capacitance imputable to this second zone 9 of the insulating layer of gate oxide, that is the $C_D$ capacitance shown in the diagram of FIG. 2, has an entirely parasitic character and, as discussed before, tends to reduce the intensity of the electric field which may be established between the floating gate and the drain of the device, i.e. through the tunnel oxide, upon application of a certain voltage between the drain 17 and the control gate 21.

It has now been found that by utilizing two different thicknesses of the gate oxide layer, i.e. by having a gate oxide layer with a substantially increased thickness relative to the "injection" zone separating the floating gate from the drain region of the cell and within which the tunnel oxide "window" is formed, it is possible to decisively improve the threshold voltage characteristics of the cell.

Figure 4B:
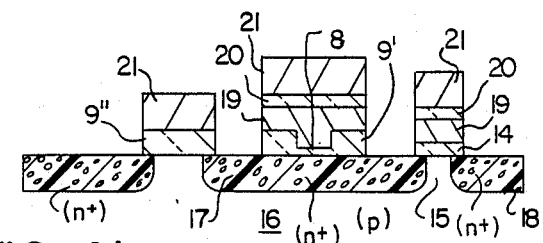
FIG. 4b shows an elevation cross section of an elementary FLOTOX cell made in accordance with the present invention.

The structure of a FLOTOX cell according to the present invention is shown in FIG. 4b, wherein the same numbers, used in FIGS. 3 and 4a, are utilized for indicating equivalent parts. As it may be observed, though maintaining the tunnel oxide 8 thickness equal to the thickness of the tunnel oxide of the known structure of FIG. 4a, the gate oxide layer of the zone 9 has a greater thickness of that than the zone 14 (i.e. over the real control zone overlying the channel region 15 of the device).

Advantageously, also the gate oxide 9'' of the select transistor 11 in series with the memory cell 10 may be formed with the same increased thickness such as formed over the drain region of the memory cell. In fact such a select transistor 11 is generally subject to high level supply voltage and the increased thickness of the gate oxide thereof improves its breakdown characteristics, also according to that disclosed in the copending U.S. patent application Ser. No. 27,976 filed on Mar. 19, 1987 in the name of the present assignee, inventors: Paolo Pic co, Tiziana Cavioni and Alfonso Maurelli.

For example, by doubling the thickness of the gate oxide in the zone 9 with respect the the normal thickness of the gate oxide in the channel zone 14, it is possible to halve the capacitive contribution due to the drain coupling capacitance ($C_D$), thus greatly improving the capacitance ratio $a_W$.

Preferably, if the gate oxide 14 has a thickness of about 300 Å, in the "injection" or drain zone 9, the thickness of the oxide layer will be increased up to about 600–700 Å.

Figure 5A:
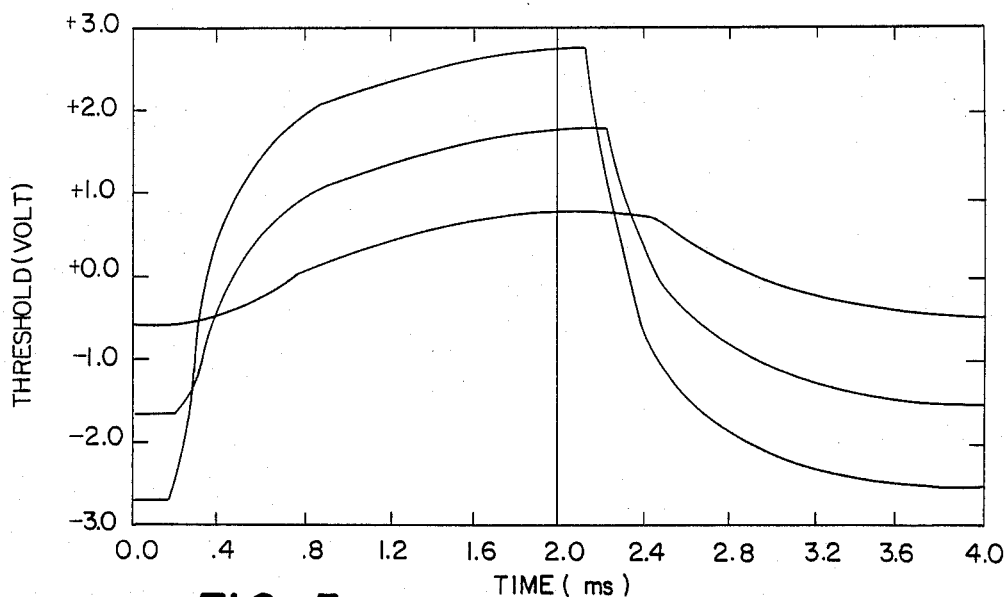
Figure 5B:
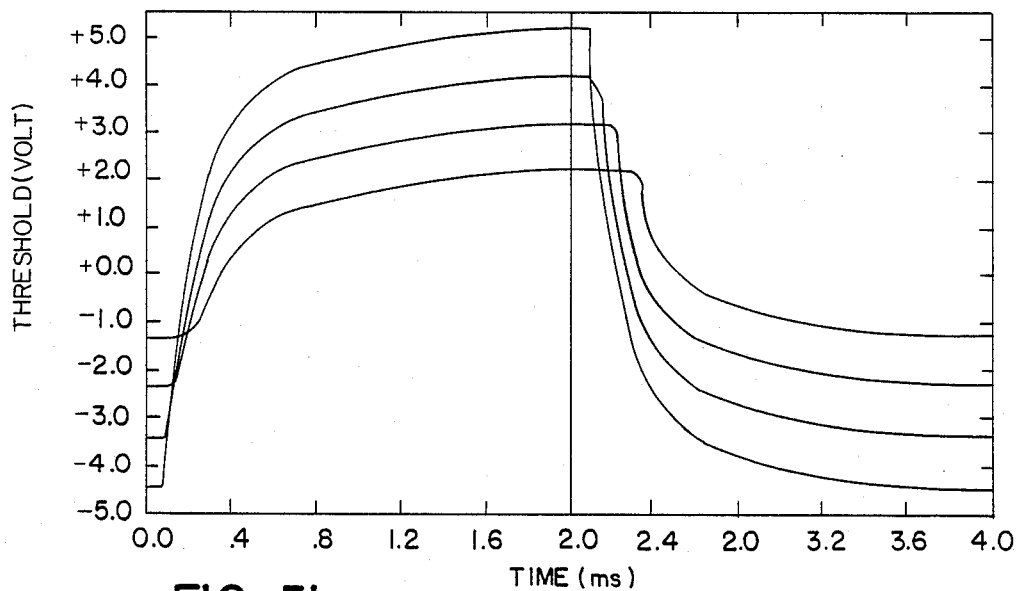
FIG. 5b is a diagram of the programming characteristics of an elementary FLOTOX cell made in accordance with the present invention and shown in FIG. 4b.

In FIGS. 5a and 5b are shown the threshold voltage characteristics of a conventional type FLOTOX memory cell and of a FLOTOX memory cell modified according to the present invention, respectively, keeping unchanged all other structural parameters. The three characteristics: A, B and C of FIG. 5a, relative to the conventional type FLOTOX cell, correspond to the test conditions reported herein below:

| A | B | C |
|---|---|---|
| Vd = 14.00 V | Vd = 13.00 V | Vd = 12.00 V |
| Vg = 15.00 V | Vg = 14.00 V | Vg = 13.00 V |
| SOURCE Floating | SOURCE Floating | SOURCE Floating |
| Vverg = .378 V | Vverg = .378 V | Vverg = .378 ms |
| T-imp = 2.00 ms | T-imp = 2.00 ms | T-imp = 2.00 ms |
| Vt = 5.53 V | Vt = 3.45 V | Vt = 1.38 V |
| RC = .27 ms | RC = .27 ms | RC = .27 ms |

The four characteristics: A', B', C' and D' of FIG. 5b, relative to the FLOTOX cell of the present invention, correspond to the test conditions reported herein below:

| A' | B' |
|---|---|
| Vd = 14.00 V | Vd = 13.00 V |
| Vg = 15.00 V | Vg = 14.00 V |
| SOURCE Floating | SOURCE Floating |
| Vverg = .398 V | Vverg = .399 V |
| Vmin = −4.521 V | Vmin = −3.445 V |
| Vmax = 5.186 V | Vmax = 4.195 V |
| Vt = 9.72 V | Vt = 7.64 V |
| RC = .270 ms | RC = .270 ms |

| C' | D' |
|---|---|
| Vd = 12.00 V | Vd = 11.00 V |
| Vg = 13.00 V | Vg = 12.00 V |
| SOURCE Floating | SOURCE Floating |
| Vverg = .299 V | Vverg = .398 V |
| Vmin = −2.383 V | Vmin = −1.342 V |
| Vmax = 3.179 V | Vmax = 2.185 V |
| Vt = 5.56 V | Vt = 8.53 V |
| RC = .270 ms | RC = .270 ms | where:
Vd = drain voltage
Vg = control gate voltage
Vverg = threshold voltage of vergin cell
Vmin = threshold voltage after erasing
Vmax = threshold voltage after writing
T-imp = write and erase signal duration
Vt = threshold voltages gap
Rc = time constant As it may be verified by comparing the diagrams of FIGS. 5a and 5b, the threshold voltage gap is decisively greater in the cell to the invention with respect of the gap obtained in a conventional type cell. This naturally allows the effecting of write and erase operations with relatively lower biasing voltages.

Such improved characteristics of the FLOTOX cell of the invention are obtained without increasing the area occupied by each single cell and without reducing the thickness of the insulating layer between the floating gate (first level of polycrystalline silicon) and the control gate (second level of polycrystalline silicon) or the area of the tunnel oxide within the injection window, i.e. without increasing the criticality of the fabrication process (that is without negatively influencing the production yield).

The disposition and connection of the single memory devices, that is of the elementary FLOTOX cells and of their respective select transistors, for forming a line of memory is the customary one, according to which the source region of all the elementary cells are connected to ground, the control gates of all the cells are connected to a program line, the gates of the select transistors are connected to a line called select line and the drain terminal of each of the various select transistors represents the terminal of each column of such a line of memory.

All the elementary cells may be cleared of any electrical charge by bringing both the program line and the select line to a sufficiently high voltage while connecting to ground the column terminals.

To write a byte of data, the program line is grounded and the columns of the selected byte are raised or lowered according to the data pattern, while maintaining the select line to a high voltage.

As already pointed out, fabrication of the FLOTOX memory cells of the present invention does not require any substantial modification of the fabrication process. In particular, the fabrication of the FLOTOX cells of the present invention is immediately manageable within advanced CMOS processes, such as the one described in the copending U.S. patent application Ser. No. 27,976 already mentioned before, which discloses a method to form a gate oxide layer with nonuniform thickness and essentially with an appropriately increased thickness over zones destined to the realization of circuit components for high voltage in respect to the thickness of the same gate oxide layer over remaining zones destined to the formation of circuit components for low voltage. In such a process, it will be sufficient to extend the gate oxide mask for the high voltage circuit section to an extent sufficient to determine the formation of a gate oxide with an increased thickness also in the injection zones (drain-floating gate coupling zone) of the memory cells arranged in arrays.

The process sequence hereinbelow described making reference to the series of figures from 6 to 20, is one example of a suitable method by which the memory device of the present invention may be fabricated.

Figure 6:
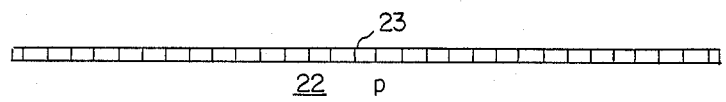

Over a monocrystalline semiconductor material 22 of a first type of conductivity (commonly p doped monocrystalline silicon), pre-oxidized, a layer of silicon nitride 23 is deposited (FIG. 6).

Figure 7:
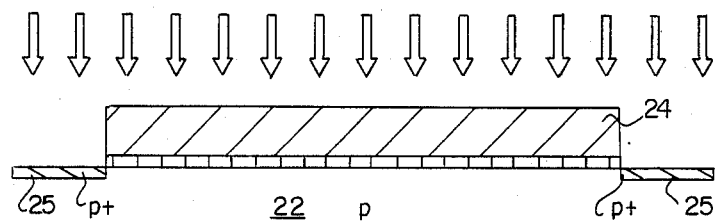

The active areas are masked with photoresist 24 and the so-called field implantation (25) is performed (FIG. 7).

Figure 8:
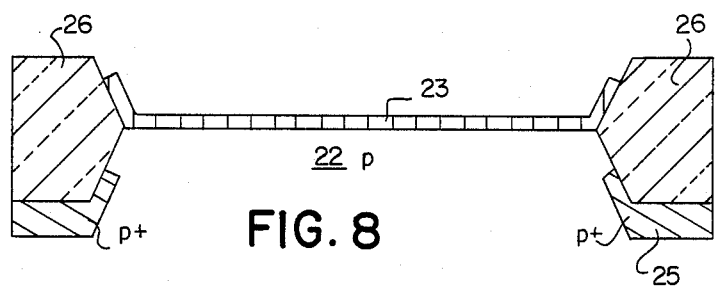

After having removed the masking material, the wafer being processed is heat treated for growing the thick field oxide layer 26 over the areas unprotected by the nitride layer 23. Simultaneously, the dopant, implanted during the field implantation step, diffuses in the silicon in the region immediately underlying the field oxide 26 (FIG. 8).

Figure 9:
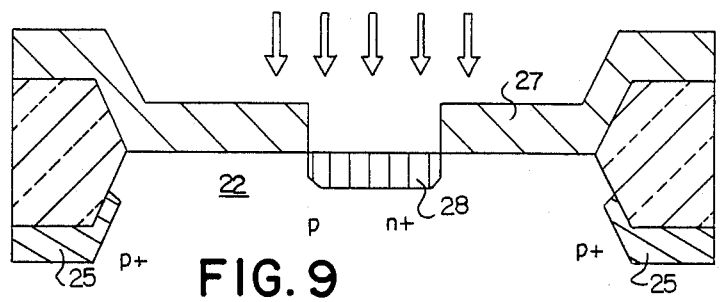

After having removed the layer of silicon nitride 23, a photoresist mask 27 for the so-called FLOTOX implant is defined over the surface of the wafer and impurities of a second type of conductivity are implanted (in the case shown n conductivity impurities) for making the n+ dopant region 28 which will represent the drain region of the device (FIG. 9).

Figure 10:
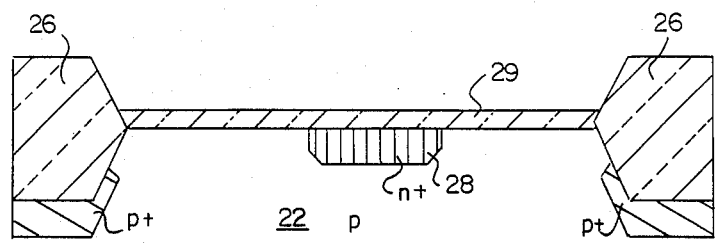

After having removed the masking material 27 and the thin oxide layer grown as a pre-conditioning operation over the silicon surface, under particularly controlled conditions of freedom from contaminants, a new layer of silicon oxide is grown for forming the so-called gate oxide 29 (FIG. 10).

Figure 11:
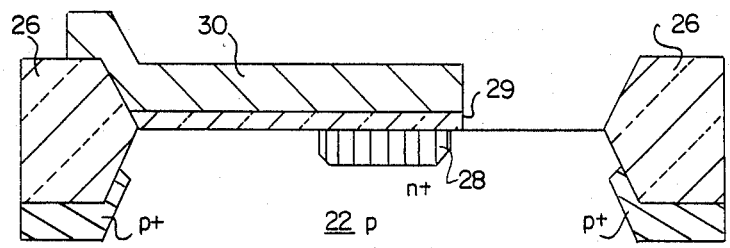

A new photoresist mask 30 is formed and the gate oxide layer formed udring the preceding step is removed from the areas not covered by the photoresist (FIG. 11).

Figure 12:
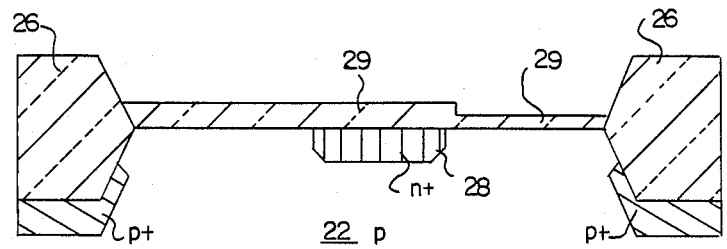

After having removed the masking material, under the same particularly controlled conditions of freedom from contaminants, a new growth of gate oxide is performed. As it may be observed in FIG. 12, over the area, previously covered by the photoresist mask, the pre-existing gate oxide layer increases its thickness to an amount equivalent to the thickness grown during this step over the silicon surface in the areas previously not covered by the photoresist mask. In this way, it is possible to place over the active areas (i.e. confined by the field oxide) different thicknesses of the gate oxide layer.

Figure 13:
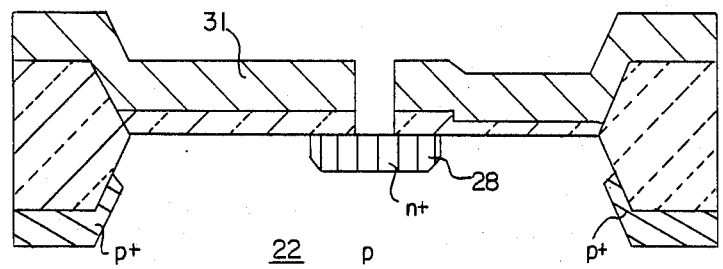
Figure 14:
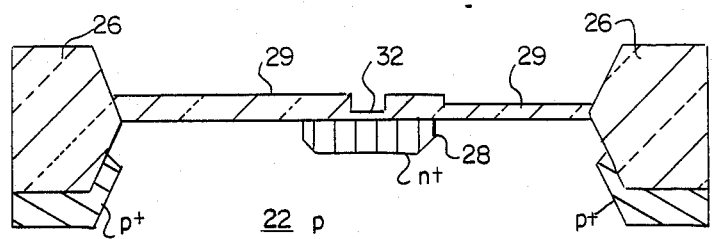

As in conventional fabrication processes, a new photoresist mask 31 is formed for defining the tunnel area and in correspondence of such a window, the silicon oxide is attacked until the underlying monocrystalline silicon of the drain region is exposed (FIG. 13). After havig removed the masking material 31, under conditions of particularly controlled freedom from contaminants, an extremely thin layer of silicon oxide 32 is grown over the tunnel area (FIG. 14).

Figure 15:
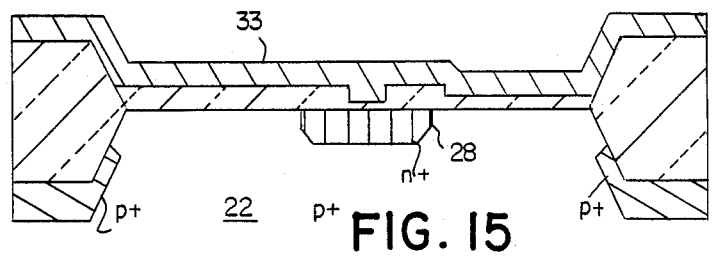
Figure 16:
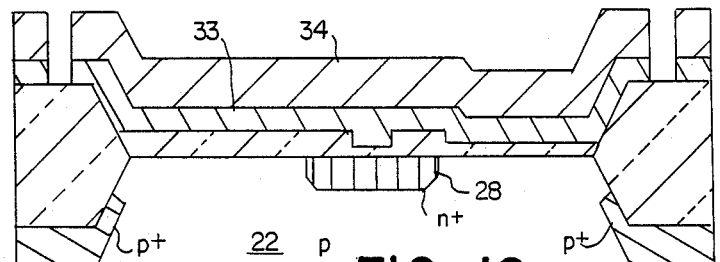

The first level of polycrystalline silicon 33 is then deposited and appropriately doped for increasing its electrical conductivity (FIG. 15). A mask 34 is then formed for defininig the first level of polycrystalline silicon and the polycrystalline silicon is attacked, thus defining the edge along one direction of the floating gate structure 33 of the device (FIG. 16).

Figure 17:
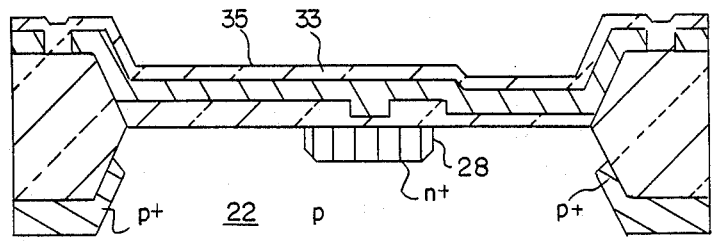

After having removed the masking material 34, a layer of silicon oxide or of an equivalent dielectric material 35 is grown or deposited preferably by means of a chemical vapor deposition process (FIG. 17).

Figure 18:
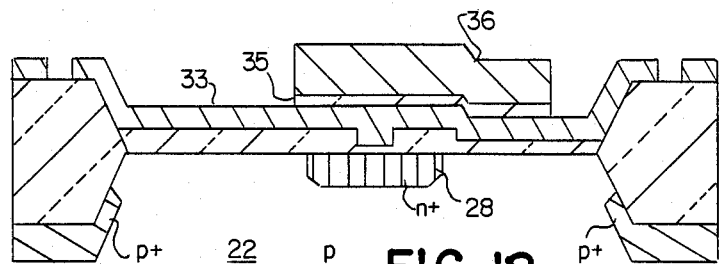

A new photoresist mask (also called matrix mask) 36 is formed for completing the definition of the active areas of the FLOTOX memory cell and the layer of dielectric material is attacked until removing it completely over the zones unprotected by the mask (FIG. 18), i.e. defining the floating gate structure along a direction perpendicular to the direction of the edges previously defined by means of the mask 34.

Figure 19:
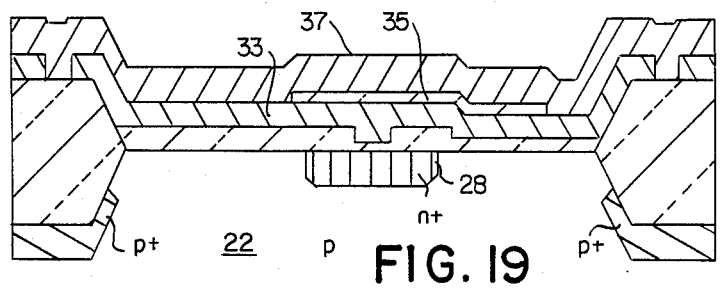

A second layer of polycrystalline silicon 37 is deposited after having removed the masking material 36 and it is doped for increasing its electrical conductivity (FIG. 19).

The process contemplates further the growth of an oxide layer over the second layer or level of polycrystalline silicon 37. By means of suitable masks, the geometry of the second level of polycrystalline silicon over the cell section of the wafer as well as over the circuitry section of the wafer is defined and the second level of polycrystalline silicon is attacked together with the oxide grown over it for improving the attack characteristics and together also with the layer of oxide or of other equivalent dielectric material 35 separating the two levels of polycrystalline silicon.

Figure 20:
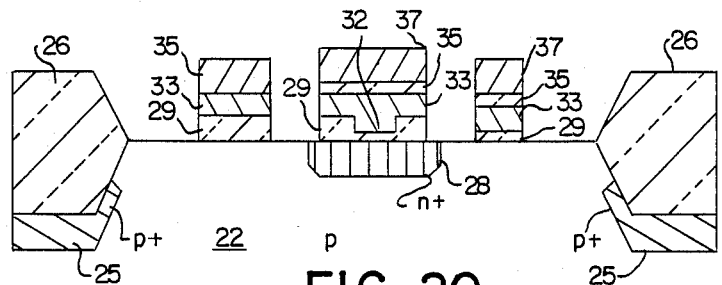

The masking material is removed and a new masking step is performed leaving exposed only the area containing the memory cells, a further attack of the first level of polycrystalline silicon is performed using as mask such a superficial layer of oxide grown over it and arresting the attack on the gate oxide. The masking material is removed and the gate oxide is removed from the zones not protected from the polycrystalline silicon until the monocrystalline silicon substrate is exposed (FIG. 20).

The fabrication process will then proceed in a customary way as any silicon gate CMOS process, thus obtaining a structure similar to that shown in FIG. 4b. The process will continue, in fact, with the implantation of a dopant of said second type of conductivity in the exposed areas of the monocrystalline silicon substrate, thus completing the formation of the drain region of the device, the formation of the source region and of the drain region of the associated select MOS transistor, formed in series with the FLOTOX cell, the formation of the contacts and of the various insulating and metal layers.

The semiconductor material 22 on which the distinct elementary memory devices are formed, may also be a "well" region of a certain type of conductivity (e.g. p doped silicon in the case shown) formed in a substrate of a semiconductor material of a different type of conductivity (e.g. n doped silicon).

What I claim is:

1. An electrically alterable, floating gate type, nonvolatile, semiconductor memory device comprising:

a substrate of a semiconductor material having a channel region of a first type of conductivity contained between a first and a second region of a second type of conductivity, formed at the surface of said substrate of semiconductor material, said channel region providing a region in the semiconductor material capable of passing an electric current between said first and said second region;

a first level of conducting material forming a floating gate extending over said channel region between said first and said second region and over an injection area above one of said first and a second region, said floating gate being electrically insulated from the semiconductor material by a layer of gate oxide having an injection window within said injection area, the insulating layer within said window being represented by a layer of tunnel oxide essentially thinner than the layer of gate oxide; and a second level of conducting material, insulated from said first level of conducting material and forming a control gate of the device;

a select MOS transistor being associated with said memory device, substantially in electrical series thereof;

wherein, the reference to said injection area, that portion of said insulating layer of gate oxide between said floating gate and the relevant one of said first or second region, except for the area of said injection window, has a thickness greater than the thickness of the portion of said layer of gate oxide superposing over said channel region, and said select MOS transistor has a gate oxide having the same thickness as the gate oxide present over said injection area of the memory device.

* * * * *